United States Patent
Byun

(10) Patent No.: US 9,378,824 B2
(45) Date of Patent: Jun. 28, 2016

(54) MEMORY SYSTEM AND OPERATION METHOD THEREOF

(71) Applicant: SK hynix Inc., Gyeonggi-do (KR)

(72) Inventor: Eu-Joon Byun, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/571,078

(22) Filed: Dec. 15, 2014

(65) Prior Publication Data

US 2016/0078946 A1    Mar. 17, 2016

(30) Foreign Application Priority Data

Sep. 17, 2014    (KR) .................. 10-2014-0123647

(51) Int. Cl.
| | |
|---|---|
| G11C 16/04 | (2006.01) |
| G11C 16/08 | (2006.01) |
| G11C 29/42 | (2006.01) |
| G11C 16/10 | (2006.01) |
| G11C 29/04 | (2006.01) |

(52) U.S. Cl.
CPC ............ *G11C 16/10* (2013.01); *G11C 16/0483* (2013.01); *G11C 16/08* (2013.01); *G11C 29/04* (2013.01); *G11C 29/42* (2013.01)

(58) Field of Classification Search
CPC .... G11C 16/0483; G11C 29/04; G11C 29/42; G11C 16/08
USPC ................................ 365/185.05, 185.11, 200
See application file for complete search history.

(56) References Cited

U.S. PATENT DOCUMENTS

| | | | | |
|---|---|---|---|---|
| 2013/0294168 | A1* | 11/2013 | Shirakawa | G11C 16/0408 365/185.17 |
| 2015/0162093 | A1* | 6/2015 | Oh | G11C 16/3445 365/185.11 |

FOREIGN PATENT DOCUMENTS

| | | |
|---|---|---|
| KR | 1020090007298 | 1/2009 |
| KR | 1020110121897 | 11/2011 |
| KR | 101274413 | 6/2013 |

* cited by examiner

*Primary Examiner* — Ly D Pham
(74) *Attorney, Agent, or Firm* — IP & T Group LLP

(57) ABSTRACT

A memory system includes a memory device having a plurality of memory blocks, each including a plurality of pages, each page including a plurality of memory cells, wherein data provided from a host device is written on the plurality of pages and the plurality of memory cells coupled to a plurality of word lines; and a controller suitable for setting word line zones by grouping the plurality of word lines by a predetermined number, and performing a bad management for the memory blocks in each of the word line zones.

18 Claims, 11 Drawing Sheets

MEMORY SYSTEM AND OPERATION METHOD THEREOF

CROSS-REFERENCE TO RELATED APPLICATIONS

The present application claims priority of Korean Patent Application No. 10-2014-0123647, filed on Sep. 17, 2014, which is herein incorporated by reference in its entirety.

BACKGROUND

1. Field

Exemplary embodiments relate to a memory system and an operation method thereof, more particularly, to a memory system and an operation method thereof for managing a bad block of a memory device.

2. Description of the Related Art

Recently, the paradigm for the computer environment has been converted into ubiquitous computing so that computer systems can be used anytime and anywhere. Due to this fact, the use of portable electronic devices such as mobile phones, digital cameras, and notebook computers has rapidly increased. In general, such portable electronic devices use a memory system which uses a memory device, that is, a data storage device. The data storage device is used as a main memory device or an auxiliary memory device of the portable electronic devices.

A data storage device using a memory device provides advantages in that there is no mechanical driving part, stability and durability are excellent, information access speed is high, and power consumption is small. Examples of data storage devices having such advantages include a universal serial bus (USB) memory device, memory cards having various interfaces, and a solid state drive (SSD).

SUMMARY

Exemplary embodiments are directed to a memory system and an operation method thereof for efficiently managing a bad block of a memory device.

In accordance with an exemplary embodiment, a memory system includes a memory device including a plurality of memory blocks, wherein each of the plurality of memory blocks includes a plurality of pages, wherein each of the plurality of pages includes a plurality of memory cells, and wherein the plurality of memory cells are coupled to a plurality of word lines; and a controller suitable for grouping the plurality of word lines to N number of word line zones, where N is integer equal to or greater than 2, wherein each of the word line zones includes M number of memory cells, where M is integer equal to or greater than 2, and wherein the controller performs a bad block management operation for word line zone by word line zone.

The controller may store a table having bitmap information for the N number of word line zones, check if a bad word line zone exists among the N number of word line zones using the bitmap information stored in the table, and perform the bad block management operation for the bad word line zone.

The controller may perform the bad block management operation by writing data, which is supposed to be written on the bad word line zone, on a new word line zone selected from the plurality of word line zones.

The new word line zone may be next to the bad word line zone based on the order of the checking operation performed by the controller.

The controller may check if a first memory cell fails a data write operation and identify a first word line zone including the first memory cell as the bad word line zone.

The controller may perform the bad block management operation for the bad word line zone.

The controller may check if a second memory cell succeeds in the data write operation and writes the data, which is supposed to be written on the first memory on the second memory cell, wherein the second memory cell is included in a second word line zone different from the first memory line zone.

The second word line zone may be next to the first word line zone based on the order of the checking operation performed by the controller.

The memory device may store a first table including bitmap information for the word line zones included in the plurality of memory blocks, and wherein the controller stores a second table including the bitmap information for the word line zones included in a specific memory block out of the plurality of memory blocks.

The controller may acquire a portion of the first table from the memory device and stores the portion of the first table as the second table.

The controller may check if a bad word line zone exists among the word line zones of the specific memory block based on the bitmap information included in the second table and perform the bad block management operation for the bad word line zone.

In accordance with another exemplary embodiment, an operation method of a memory system includes providing a first memory block including a plurality of word lines, grouping the plurality of word lines into N number of word line zones, where N is an integer equal to or larger than 2, wherein a plurality of memory cells are coupled to each of the plurality of word lines; checking if a first word line zone, which is selected from the N number of word line zones, is a bad word line zone; and performing bad block management operation for the bad word line zone.

The checking of the first word line zone may include checking the first word line zone based on a table including bitmap information for the N number of word line zones.

The performing of the bad block management operation may include writing first data, which is supposed to be written on the first word line zone, on a second word line zone, wherein the second word line zone may be a normal word line zone.

The second word line zone may be next to the first word line zone based on the order of the checking operation.

The checking of the first word line zone may include checking if a memory cell included in the first word line zone fails a data write operation, and identifying the first word line zone including the memory cell which fails the data write operation as the bad word line zone.

The performing of the bad block management operation may include checking if a second memory cell included in a second word line zone succeed in a data write operation and writing first data, which is supposed to be written on a first memory cell included in the first word line zone, on the second memory cell included in the second word line zone.

The second word line zone may be next to the bad word line zone based on the order of the checking operation.

The checking of the first word line zone may include storing a first table in the memory system, acquiring from the memory system a portion of the first table and storing the acquired data as a second table, and checking if the first word line zone is the bad word line zone based on bitmap information included in the second table.

The first table may include first bitmap information for the N number of word line zones included in the first memory block, and second bitmap information for L number of word line zones included in a second memory block, where L is integer equal to or larger than 2, and wherein the second table may include the first bitmap information but does not include the second bitmap information.

DETAILED DESCRIPTION

Figure 1:
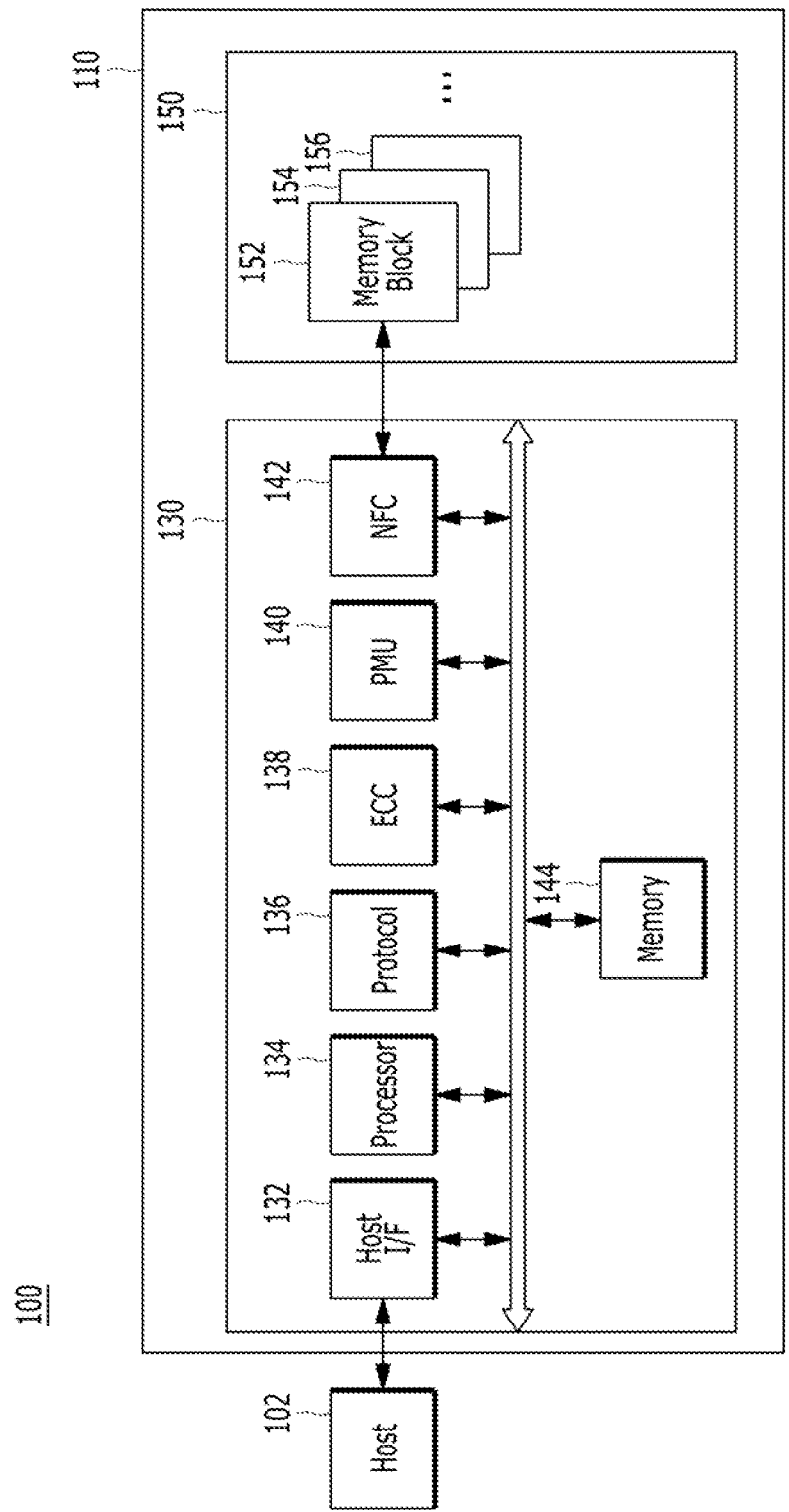
FIG. 1 is a diagram schematically illustrating a data processing system including a memory system in accordance with an embodiment.

Various embodiments will be described below in more detail with reference to the accompanying drawings. Throughout the disclosure, like reference numerals refer to like parts throughout the various figures and embodiments.

FIG. 1 is a diagram schematically illustrating a data processing system including a memory system in accordance with an embodiment.

Referring to FIG. 1, a data processing system 100 includes a host 102 and a memory system 110.

The host 102 includes, for example, a portable electronic device such as a mobile phone, an MP3 player, and a laptop computer or an electronic device such as a desktop computer, a game player, a TV, and a projector.

The memory system 110 operates in response to a request from the host 102, and in particular, stores data to be accessed by the host 102. That is, the memory system 110 may be used as a main memory device or an auxiliary memory device of the host 102. The memory system 110 may be any one of various kinds of storage devices according to the protocol of a host interface which is electrically coupled with the host 102. For example, the memory system 110 may be a storage device such as a solid state drive, a multimedia card in the form of an MMC, an eMMC (embedded MMC), an RS-MMC (reduced size MMC) and a micro-MMC. In another embodiment, the memory system 110 may be a secure digital card in the form of a SD, a mini-SD and a micro-SD, a universal serial bus (USB) storage device, a universal flash storage (UFS) device, a compact flash (CF) card, a smart media card, a memory stick, and so forth.

The storage devices which are included in the memory system 110 may be a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), an ferroelectric random access memory (FRAM), a phase change RAM (PRAM), a magnetic RAM (MRAM), and a resistive RAM (RRAM).

The memory system 110 includes a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102, which is electrically coupled with the memory system 110, may be significantly increased.

The controller 130 and the memory device 150 may be integrated into one semiconductor device and configure a memory card. For example, the controller 130 and the memory card 150 may be integrated into one semiconductor device and configure a memory card such as a Personal Computer Memory Card International Association (PCMCIA) card, a compact flash (CF) card, a smart media card n the form of an SM and an SMC, a memory stick, a multimedia card in the form of an MMC, an RS-MMC and a micro-MMC, a secure digital card in the form of a SD, a mini-SD, a micro-SD, a secure digital high capacity (SDHC), and a universal flash storage (UFS) device.

In another embodiment, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain data even after power is interrupted, stores the data provided from the host 102 through a write operation, and provides the stored data to the host 102 through a read operation. The memory device 150 includes a plurality of memory blocks 152, 154 and 156. Each of the memory blocks 152, 154 and 156 includes a plurality of pages. Each of the pages includes a plurality of memory cells to which a plurality of word lines (WL) are electrically coupled. The memory device 150 may be a nonvolatile memory device, for example, a flash memory. The flash memory may have a 3D stack structure. The structure of the memory device 150 and the 3D stack structure of the memory device 150 will be described later in detail with reference to FIGS. 2 to 11.

The controller 130 of the memory system 110 controls the memory device 150 in response to a request from the host 102. For example, the controller 130 provides the data, which is read from the memory device 150, to the host 102 and stores the data, which is provided from the host 102, in the memory device 150. Thus, the controller 130 controls the operations of the memory device 150, such as read, write, program and erase operations.

The controller 130 includes a host interface unit (Host I/F) 132, a processor (Processor) 134, a protocol unit (Protocol) 136, an error correction code (ECC) unit (ECC) 138, a power management unit (PMU) 140, a NAND flash controller (NFC) 142, and a memory 144.

The host interface unit 132 processes commands and data of the host 102 and may be configured to communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 detects and corrects an error included in the data when reading the data stored in the memory device 150. That is, after performing error correction decoding for the data read from the memory device 150, the ECC unit 138 may determine whether the error correction decoding has succeeded, output an indication signal according to the determination result, and correct an error bit of the read data by using parity bits generated in an ECC encoding process. The ECC unit 138 may not correct error bits if the number of error bits is equal to or larger than a threshold number of correctable error bits. In that case, the ECC unit 138 may output an error correction fail signal indicating incapability of correcting error bits.

The ECC unit 138 may perform error correction by using, but not limited to, an LDPC (low density parity check) code, a BCH (Bose, Chaudhuri, Hocquenghem) code, a turbo code, a Reed-Solomon code, a convolution code, an RSC (recursive systematic code), TCM (trellis-coded modulation), or BCM (Block coded modulation). The ECC unit 138 may include all circuits, systems, or devices for error correction.

The protocol unit 136 stores and manages protocols for the controller 130 to control the memory device 150 in response to a request from the host 102. The PMU 140 provides and manages power for the controller 130, that is, power for the component elements included in the controller 130.

The NFC 142, as a memory interface, performs interfacing between the controller 130 and the memory device 150 to allow the controller 130 to control the memory device 150 in response to a request from the host 102. The NFC 142 generates control signals for the memory device 150 and processes data according to the control of the processor 134. The memory device 150 may be a flash memory, in particular, a NAND flash memory.

The memory 144 as the working memory of the memory system 110, and the controller 130, stores data for driving the memory system 110 and the controller 130. The controller 130 may control the memory device 150 in response to a request from the host 102. For example, the controller 130 may provide the data which is read from the memory device 150 to the host 102 and may store the data which is provided from the host 102 in the memory device 150. When the controller 130 controls the operations of the memory device 150, such as read, write, program and erase operations, the memory 144 stores data which is needed to allow such operations to be performed by the memory system 110, that is, between the controller 130 and the memory device 150.

The memory 144 may be a volatile memory. For example, the memory 144 may be a static random access memory (SRAM) or a dynamic random access memory (DRAM). As described above, the memory 144 stores data necessary to perform data read and write operations between the host 102 and the memory device 150 and stores data resulting from the data read and write operations. The memory 144 includes a program memory, a data memory, a write buffer, a read buffer, a map buffer, and so forth.

The processor 134 controls general operation of the memory system 110, and controls a write operation or a read operation for the memory device 150 in response to a write request or a read request from the host 102. The processor 134 drives firmware which is referred to as a flash translation layer (FTL) to control the general operation of the memory system 110. The processor 134 may be a microprocessor or a central processing unit (CPU).

A management unit (not shown) for performing management of the memory device 150, for example, the bad block management, is included in the processor 134. The management unit checks if a bad block is included in the plurality of memory blocks, and performs the bad block management operation to locate a bad block, if any. When the memory device 150 is a flash memory, for example, a NAND flash memory, a program fail may occur during the writing or the programming operation due to the characteristic of a NAND logic function. The management that is, the bad block management, is a process of identifying a memory block in which a program fail has occurred and tagging the identified memory block as a bad memory block and rewriting or reprogramming the program-failed data, which is written in the bad memory block, in a new memory block. The memory device in the memory system in accordance with an embodiment will be described in detail with reference to FIGS. 2 to 11.

Figure 2:
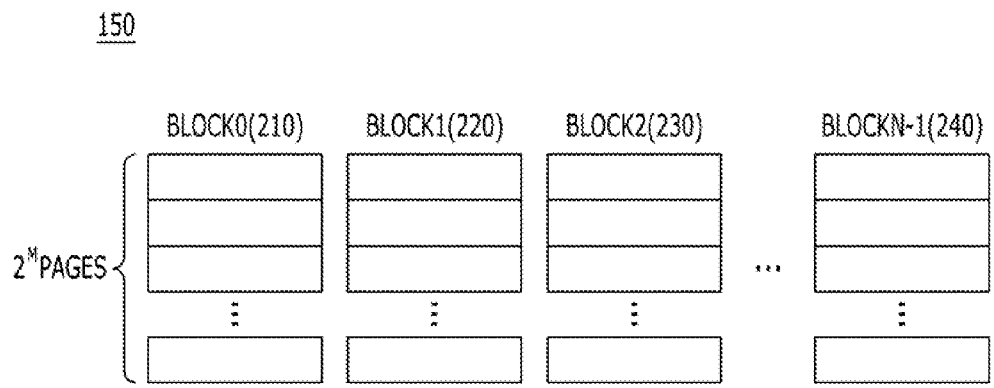
FIG. 2 is a diagram schematically illustrating a memory device in a memory system in accordance with an embodiment.
Figure 3:
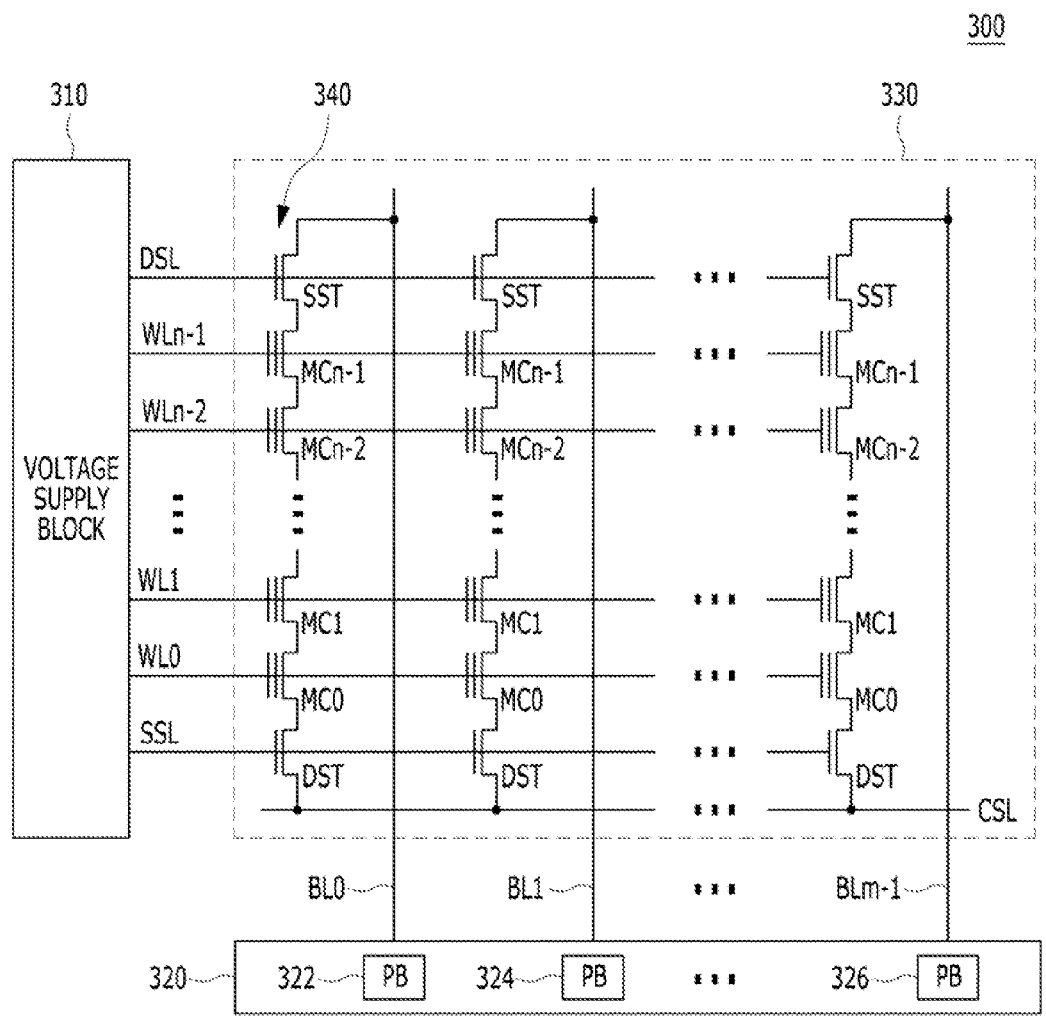
FIG. 3 is a diagram schematically illustrating a memory cell array circuit of a memory block in a memory device in accordance with an embodiment.

FIG. 2 is a diagram schematically illustrating a memory device in a memory system in accordance with an embodiment. FIG. 3 illustrates a memory cell array circuit of a memory block in a memory device in accordance with an embodiment. FIGS. 4 to 11 illustrate the structures of a three-dimensional nonvolatile memory device in accordance with an embodiment.

Referring to FIG. 2, the memory device 150 includes a plurality of memory blocks, for example, a zeroth block (BLOCK0) 210, a first block (BLOCK1) 220, a second block (BLOCK2) 230 and an N-1$^{th}$ block (BLOCKN-1) 240. Each of the blocks 210, 220, 230 and 240 includes a plurality of pages. For example, the number of pages per block may be $2^M$, that is, $2^M$ PAGES. The number of pages is not limiting. In another embodiment, each of the plurality of memory blocks may include M number of pages, where M is an integer. Each of the pages includes a plurality of memory cells to which a plurality of word lines (WL) are electrically coupled.

Each of the memory blocks 210, 220, 230 and 240 stores data provided from the host device 102 through a write operation and provides the stored data to the host 102 through a read operation.

Referring to FIG. 3, in the memory system 110, a memory block 330 of a memory device 300 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to corresponding bit lines BL0 to BLm-1, respectively.

In FIG. 3, the memory block 330 is configured by NAND flash memory cells. However, the memory block 330 of the memory device 300 in accordance with an embodiment is not limited to a NAND flash memory and may be a NOR flash memory, a hybrid flash memory in which at least two kinds of memory cells are combined, or a one-NAND flash memory in which a controller is built in a memory chip. The operational characteristics of a semiconductor device may be obtained by employing either a flash memory device in which a charge storing layer is configured by conductive floating gates or a charge trap flash (CTF) in which a charge storing layer is configured by a dielectric layer.

A voltage supply block 310 of the memory device 300 may provide word line voltages for example, a program voltage, a read voltage, and a pass voltage, to respective word lines according to an operation mode. The voltage supply block 310 may provide voltages to bulks for example, well regions, formed with memory cells. The voltage generating operation of the voltage supply block 310 may be performed under the control of a control circuit (not shown). The voltage supply block 310 may generate a plurality of variable read voltages, generate a plurality of read data select one of the memory blocks (or sectors) of a memory cell array in response to the control of the control circuit, select one of the word lines of the selected memory block, and provide the word line voltages to the selected word line and unselected word lines.

A read/write circuit 320 of the memory device 300 is controlled by the control circuit, and may operate as a sense amplifier or a write driver according to an operation mode. For example, in a verification/normal read operation mode, the read/write circuit 320 may operate as a sense amplifier for reading data from the memory cell array. Also, in a program operation mode, the read/write circuit 320 may operate as a write driver which drives bit lines according to data to be stored in the memory cell array. The read/write circuit 320 may receive data to be written in the memory cell array from a buffer (not shown) in the program operation mode and may drive the bit lines according to the inputted data. To this end, the read/write circuit 320 may include a plurality of page buffers (PB) 322, 324 and 326 respectively corresponding to columns or bit lines, or pairs of columns or pairs of bit lines. A plurality of latches (not shown) may be included in each of the page buffers 322, 324 and 326. Detailed descriptions will be made with reference to FIGS. 4 to 11 for the memory device in the memory system 110 in accordance with an embodiment. In FIGS. 4 to 11, the memory device is a 3-dimensional nonvolatile memory device.

Figure 4:
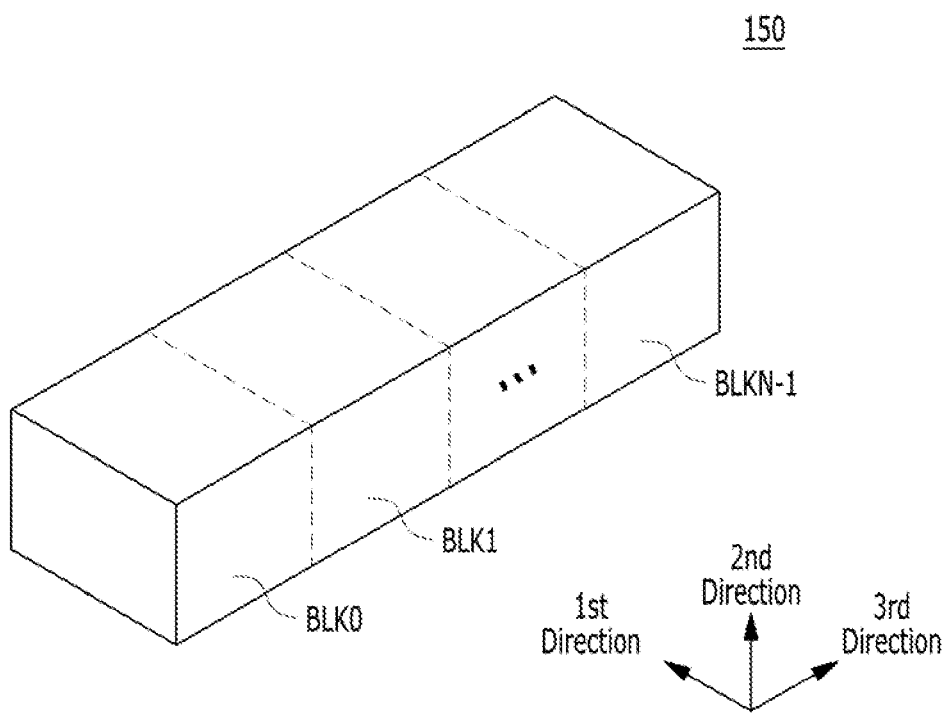
FIGS. 4 to 11 are diagrams schematically illustrating the structure of a memory device in a memory system in accordance with an embodiment.

Referring to FIG. 4, as described above, the memory device 150 may include a plurality of memory blocks BLK0 to BLKN−1. FIG. 4 is a block diagram illustrating the memory block of the memory device shown in FIG. 2. Each of the memory blocks BLK may be in a 3-dimensional structure or a vertical structure. For example, the respective memory blocks BLK may include structures which extend in first to third directions, for example, the x-axis direction, the y-axis direction and the z-axis direction.

The respective memory blocks BLK may include a plurality of NAND strings NS which extend in the second direction. The plurality of NAND strings NS may be provided in the first direction and the third direction. Each NAND string NS may be electrically coupled to a bit line BL, at least one string select line SSL, at least one ground select line GSL, a plurality of word lines WL, at least one dummy word line DWL, and a common source line CSL. The respective memory blocks may be electrically coupled to a plurality of bit lines BL, a plurality of string select lines SSL, a plurality of ground select lines GSL, a plurality of word lines WL, a plurality of dummy word lines DWL, and a plurality of common source lines CSL.

Figure 5:
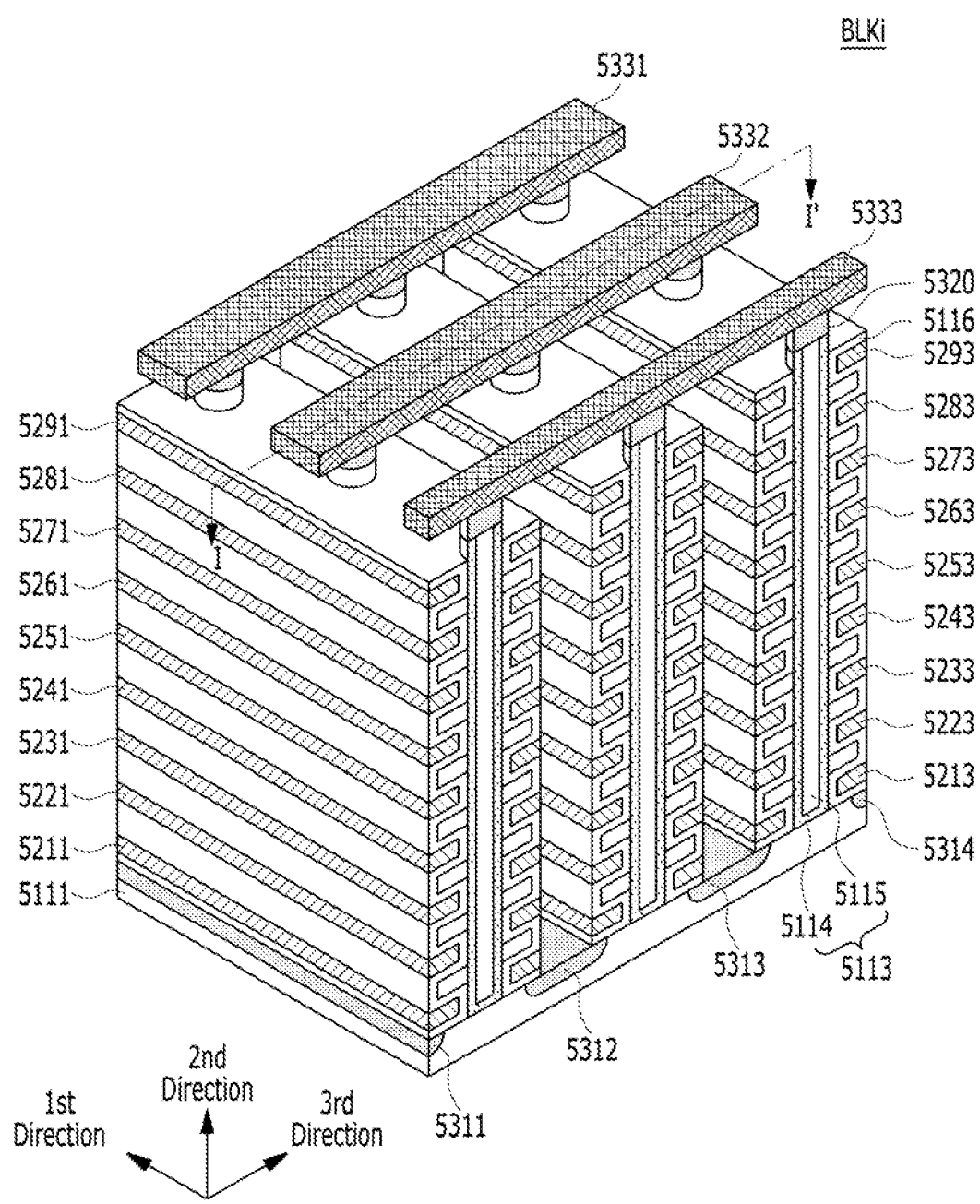
Figure 6:
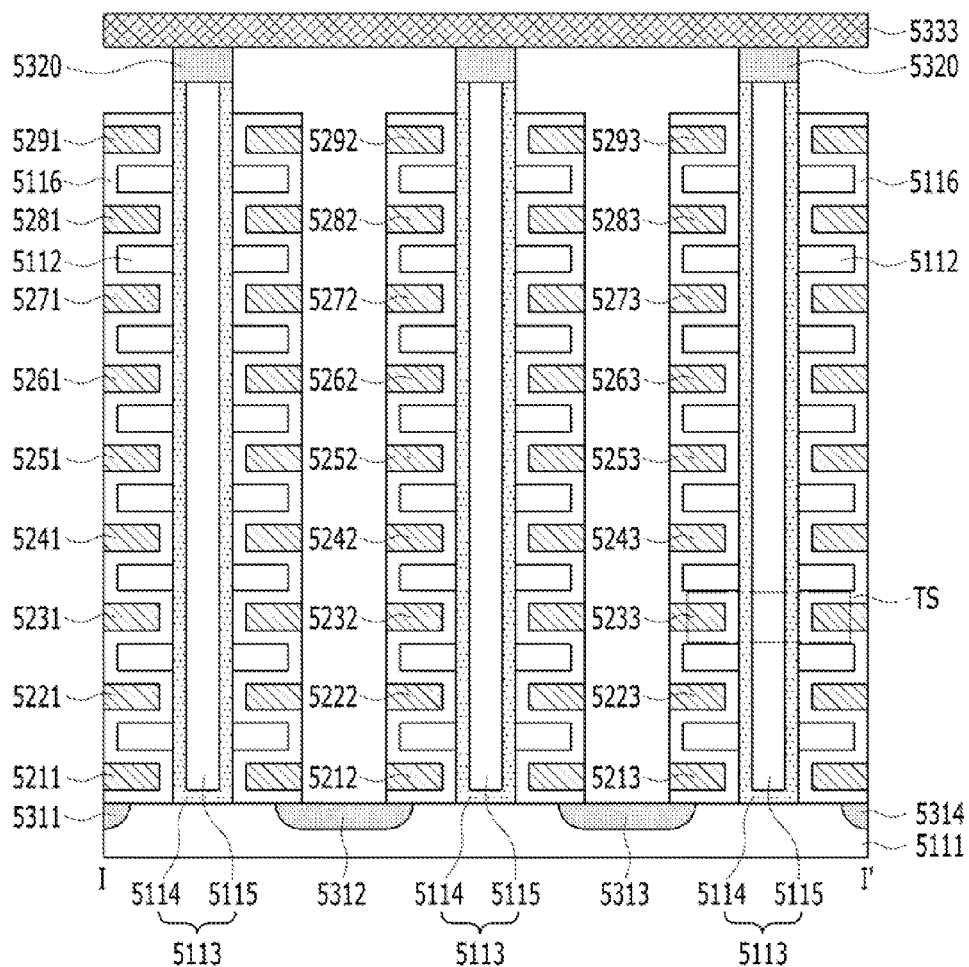

Referring to FIGS. 5 and 6, a certain memory block BLKi among the plurality of memory blocks of the memory device 150 may include structures which extend in the first to third directions. FIG. 5 is a perspective view of a structure where the memory device in accordance with an embodiment is a 3-dimensional nonvolatile memory device. In FIG. 5, the memory block BLKi may have the plurality of memory blocks of FIG. 4. FIG. 6 is a cross-sectional view taken along the line of FIG. 5.

A substrate 5111 may be provided. For example, the substrate 5111 may include a silicon material doped with a first type impurity. For example, the substrate 5111 may include a silicon material doped with a p-type impurity or may be a p-type well for example, a pocket p-well, and include an n-type well which surrounds the p-type well. In an embodiment, the substrate 5111 is p-type silicon. However, the substrate 5111 not limited to the p-type silicon.

A plurality of doping regions 5311, 5312, 5313 and 5314 which extend in the first direction may be provided on the substrate 5111. For example, the plurality of doping regions 5311, 5312, 5313 and 5314 may be a second-type of region different from the substrate 5111. For example, the plurality of doping regions 5311, 5312, 5313 and 5314 may be doped with an n-type dopant. In an embodiment, first to fourth doping regions 5311, 5312, 5313 and 5314 are n-type doping regions. However, the first to fourth doping regions 5311, 5312, 5313 and 5314 are not limited to the n-type doping regions.

In the region on the substrate 5111 between the first and second doping regions 5311 and 5312, a plurality of dielectric materials 5112 which extend in the first direction may be sequentially provided in the second direction. For example, the plurality of dielectric materials 5112 and the substrate 5111 may be separated from one another by a predetermined distance in the second direction. For example, the dielectric materials 5112 may include a dielectric material such as a silicon oxide.

In the region on the substrate 5111 between the first and second doping regions 5311 and 5312, a plurality of pillars 5113 which are sequentially disposed in the first direction and pass through the dielectric materials 5112 in the second direction may be provided. For example, the plurality of pillars 5113 may respectively pass through the dielectric materials 5112 and may be electrically coupled with the substrate 5111. For example, each pillar 511 may be configured by a plurality of materials. For example, a surface layer 5114 of each pillar 5113 may include a silicon material doped into the first type. For example, the surface layer 5114 of each pillar 5113 may include a silicon material doped into the same type as the substrate 5111. In an embodiment, the surface layer 5114 of each pillar 5113 includes p-type silicon. However, the surface layer 5114 of each pillar 5113 is not limited to the p-type silicon.

An internal layer 5115 of each pillar 5113 may be configured by a dielectric material. For example, the internal layer 5115 of each pillar 5113 may be filled by a dielectric material such as a silicon oxide.

In the region between the first and second doping regions 5311 and 5312, a dielectric layer 5116 may be provided on the surfaces of the dielectric materials 5112, the pillars 5113, and the substrate 5111. For example, the thickness of the dielectric layer 5116 may be smaller than half (½) of the distance between the dielectric materials 5112. That is, a region, in which a material other than the dielectric material 5112 and the dielectric layer 5116 may be disposed, may be provided between (i) the dielectric layer 5116 which is provided on the bottom surface of a first dielectric material 5112 among the dielectric materials 5112 and (ii) the dielectric layer 5116 which is provided on the top surface of a second dielectric material 5112 among the dielectric materials 5112. The second dielectric material 5112 lies below the first dielectric material 5112.

In the region between the first and second doping regions 5311 and 5312, conductive materials 5211, 5221, 5231, 5241, 5251, 5261, 5271, 5281 and 5291 may be provided on the surface of the dielectric layer 5116. For example, the conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 on the bottom surface of the dielectric material 5112 adjacent to the substrate 5111 and (ii) the dielectric layer 5116 on the substrate 5111.

The conductive material which extends in the first direction may be provided between the dielectric layer 5116 on the top surface of a certain dielectric material 5112 among the dielectric materials 5112 and the dielectric layer 5116 on the bottom surface of another dielectric material 5112 among the dielectric materials 5112 which is disposed over the certain dielectric material 5112. For example, the plurality of conductive materials 5221, 5231, 5241, 5251, 5261, 5271 and 5281 which extend in the first direction may be provided between the dielectric materials 5112. The conductive material 5291 which extends in the first direction may be provided over the uppermost dielectric material 5112. For example, the conductive materials 5211, 5221, 5231, 5241, 5251, 5261, 5271, 5281 and 5291 which extend in the first direction may be metallic material. For example, the conductive materials 5211, 5221, 5231, 5241, 5251, 5261, 5271, 5281 and 5291 which extend in the first direction may be conductive material such as polysilicon.

In the region between the second and third doping regions 5312 and 5313, the same structures as the structures provided between the first and second doping regions 5311 and 5312 may be provided. For example, in the region between the second and third doping regions 5312 and 5313, a plurality of dielectric materials 5112 which extend in the first direction, a plurality of pillars 5113 which are sequentially disposed in the first direction and pass through the plurality of dielectric materials 5112 in the second direction, a dielectric layer 5116 which is provided on the surfaces of the plurality of dielectric materials 5112 and the plurality of pillars 5113, and a plurality of conductive materials 5212, 5222, 5232, 5242, 5252, 5262, 5272, 5282 and 5292 which extend in the first direction may be provided.

In the region between the third and fourth doping regions 5313 and 5314, the same structures as the structures provided between the first and second doping regions 5311 and 5312 may be provided. For example, in the region between the third and fourth doping regions 5313 and 5314, a plurality of dielectric materials 5112 which extend in the first direction, a plurality of pillars 5113 which are sequentially disposed in the first direction and pass through the plurality of dielectric materials 5112 in the second direction, a dielectric layer 5116 which is provided on the surfaces of the plurality of dielectric materials 5112 and the plurality of pillars 5113, and a plurality of conductive materials 5213, 5223, 5233, 5243, 5253, 5263, 5273, 5283 and 5293 which extend in the first direction may be provided.

Drains 5320 may be respectively provided on the plurality of pillars 5113. For example, the drains 5320 may be silicon materials doped with second-type dopants. For example, the drains 5320 may be silicon materials doped with n-type dopants. The drains 5320 may include n-type silicon, but the drains 5320 are not limited to the n-type silicon. For example, the width of each drain 5320 may be larger than the width of each corresponding pillar 5113. For example, each drain 5320 may be provided in the shape of a pad on the top surface of each corresponding pillar 5113.

Conductive materials 5331, 5332 and 5333 which extend in the third direction may be provided on the drains 5320. The conductive materials 5331, 5332 and 5333 may be sequentially disposed in the first direction. In another embodiment, the respective conductive materials 5331, 5332 and 5333 may be electrically coupled with the drains 5320 of corresponding regions. For example, the drains 5320 and the conductive materials 5331, 5332 and 5333 which extend in the third direction may be electrically coupled with each other through contact plugs. For example, the conductive materials 5331, 5332 and 5333 which extend in the third direction may be metallic material. For example, the conductive materials 5331, 5332 and 5333 which extend in the third direction may be conductive material such as polysilicon.

In FIGS. 5 and 6, the respective pillars 5113 may be coupled to the dielectric layer 5116 and the plurality of conductive materials 5211 to 5291, 5212 to 5292 and 5213 to 5293 which extend in the first direction, to form strings. For example, the respective pillars 5113 may form NAND strings NS together with the dielectric layer 5116 and the plurality of conductive materials 5211 to 5291, 5212 to 5292 and 5213 to 5293 which extend in the first direction. Each NAND string NS may include a plurality of transistor structures TS.

Figure 7:
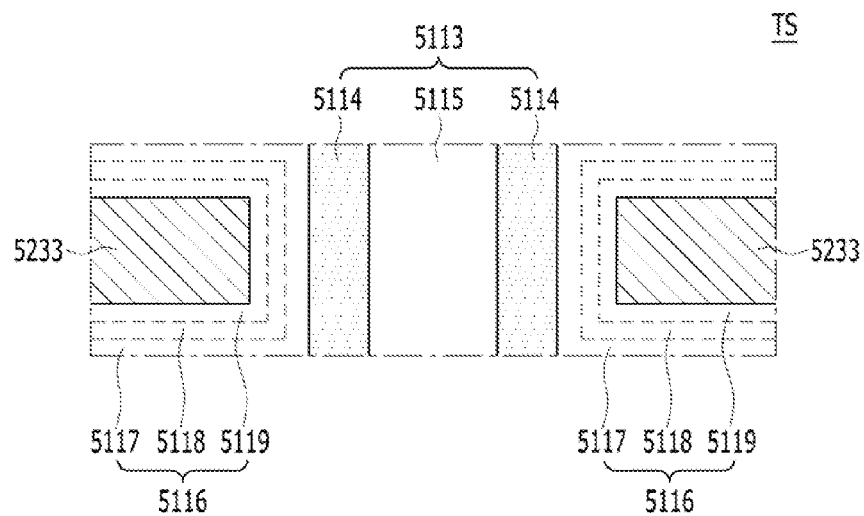

Referring to FIG. 7, which shows the transistor structure TS shown in FIG. 6, the dielectric layer 5116 may include first to third sub dielectric layers 5117, 5118 and 5119. FIG. 7 illustrates a cross-sectional view the transistor structure TS shown in FIG. 6.

The p-type silicon 5114 of the pillar 5113 may operate as a body. The first sub dielectric layer 5117 adjacent to the pillar 5113 may operate as a tunneling dielectric layer and may include a thermal oxide layer.

The second sub dielectric layer 5118 may operate as a charge storing layer. For example, the second sub dielectric layer 5118 may operate as a charge capturing layer and may include a nitride layer or a metal oxide layer, for example, an aluminum oxide layer, a hafnium oxide layer, and the like.

The third sub dielectric layer 5119 adjacent to the conductive material 5233 may operate as a blocking dielectric layer. For example, the third sub dielectric layer 5119 adjacent to the conductive material 5233 which extends in the first direction may be formed as a single layer or multiple layers. The third sub dielectric layer 5119 may be a high-k dielectric layer for example, an aluminum oxide layer, a hafnium oxide layer, and the like, which has a dielectric constant higher than the first and second sub dielectric layers 5117 and 5118.

The conductive material 5233 may operate as a gate or a control gate. That is, the gate or the control gate 5233, the blocking dielectric layer 5119, the charge storing layer 5118, the tunneling dielectric layer 5117, and the body 5114 may form a transistor or a memory cell transistor structure. For example, the first to third sub dielectric layers 5117, 5118 and 5119 may form an ONO (oxide-nitride-oxide) structure. In the following description, the p-type silicon 5114 of the pillar 5113 will be referred to as a body extending in the second direction.

The memory block BLKi may include the plurality of pillars 5113. That is, the memory block BLKi may include a plurality of NAND strings NS. The memory block BLKi may include a plurality of NAND strings NS which extend in the second direction or a direction perpendicular to the substrate 5111.

Each NAND string NS may include a plurality of transistor structures TS which are disposed in the second direction. At least one of the plurality of transistor structures TS of each NAND string NS may operate as a string select transistor SST. At least one of the plurality of transistor structures TS of each NAND string NS may operate as a ground select transistor GST.

Gates or control gates may correspond to the conductive materials 5211 to 5291, 5212 to 5292 and 5213 to 5293 which extend in the first direction. That is, the gates or the control gates may extend in the first direction and form word lines and at least two select lines for example, at least one string select line SSL and at least one ground select line GSL.

The conductive materials 5331, 5332 and 5333 which extend in the third direction may be electrically coupled to one end of the NAND strings NS. For example, the conductive materials 5331, 5332 and 5333 which extend in the third direction may operate as bit lines BL. That is, in one memory block BLKi, a plurality of NAND strings NS may be electrically coupled to one bit line BL.

The second type doping regions 5311, 5312, 5313 and 5314 which extend in the first direction may be coupled to the other end of the NAND strings NS. The second type doping regions 5311, 5312, 5313 and 5314 which extend in the first direction may operate as common source lines CSL.

The memory block BLKi includes a plurality of NAND strings NS which extend in the direction perpendicular to the substrate 5111 that is, the second direction, and may operate as a NAND flash memory block for example, a charge capturing-type memory, in which a plurality of NAND strings NS are electrically coupled to one bit line BL.

In FIGS. 5 to 7, the conductive materials 5211 to 5291, 5212 to 5292 and 5213 to 5293 which extend in the first direction are provided in 9 layers. However, it is noted that the conductive materials 5211 to 5291, 5212 to 5292 and 5213 to 5293 which extend in the first direction are not limited to the 9 layers. For example, conductive materials which extend in the first direction may be provided in 8 layers, 16 layers or a plurality of layers. That is, in one NAND string NS, the number of transistors may be 8, 16 or plural.

In FIGS. 5 to 7, 3 NAND strings NS are electrically coupled to one bit line BL. However, it is noted that the embodiment is not limited to the structure that 3 NAND strings NS are electrically coupled to one bit line BL. In another embodiment, in the memory block BLKi, m number of NAND strings NS where m is integer, may be electrically coupled to one bit line BL. According to the number of NAND strings NS which are electrically coupled to one bit line BL, the number of conductive materials 5211 to 5291, 5212 to 5292 and 5213 to 5293 which extend in the first direction and the number of common source lines 5311, 5312, 5313 and 5314 may vary as well.

In FIGS. 5 to 7, 3 NAND strings NS are electrically coupled to one conductive material which extends in the first direction. However, it is to be noted that the embodiment is not limited to 3 NAND strings NS electrically coupled to one conductive material which extends in the first direction. In another embodiment, n number of NAND strings NS where n is integer, may be electrically coupled to one conductive material which extends in the first direction. According to the number of NAND strings NS which are electrically coupled to one conductive material which extends in the first direction, the number of bit lines 5331, 5332 and 5333 may vary as well.

Figure 8:
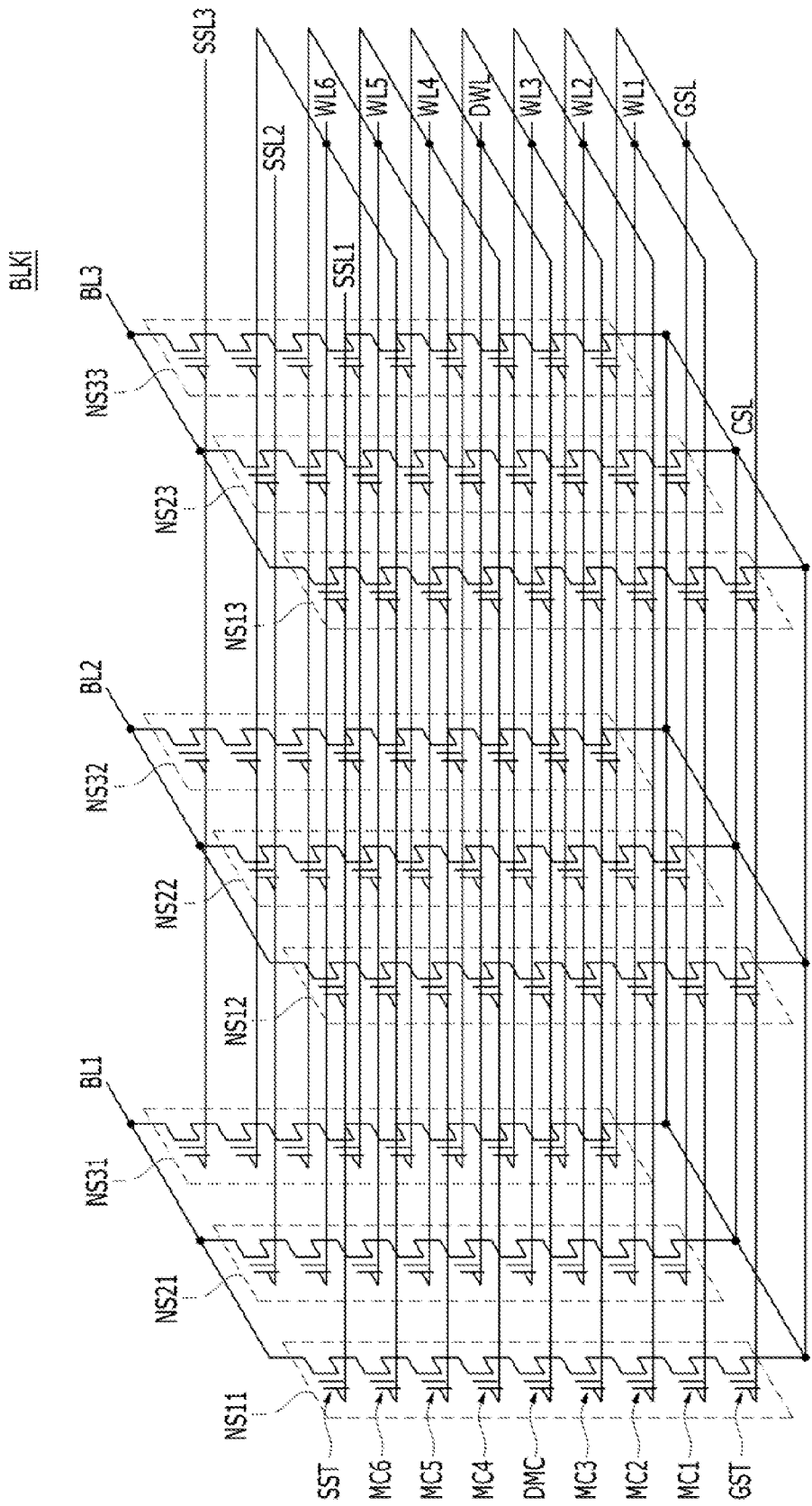

Referring to FIG. 8, in a certain block BLKi with the first structure, NAND strings NS11 to NS31 may be provided between a first bit line BL1 and a common source line CSL. FIG. 8 is a circuit diagram illustrating the equivalent circuit of the memory block BLKi with the first structure as described above with reference to FIGS. 5 to 7. The first bit line BL1 may correspond to the conductive material 5331 which extends in the third direction. NAND strings NS12 to NS32 may be provided between a second bit line BL2 and the common source line CSL. The second bit line BL2 may correspond to the conductive material 5332 which extends in the third direction. NAND strings NS13 to NS33 may be provided between a third bit line BL3 and the common source line CSL. The third bit line BL3 may correspond to the conductive material 5333 which extends in the third direction.

A string select transistor SST of each NAND string NS may be electrically coupled to a corresponding bit line BL. A ground select transistor GST of each NAND string NS may be electrically coupled to the common source line CSL. Memory cells MC may be provided between the string select transistor SST and the ground select transistor GST of each NAND string NS.

In an embodiment, NAND strings NS may be defined by the unit of row and column. NAND strings NS which are commonly electrically coupled to one bit line may form one column. For example, the NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one string select line SSL may form one row. For example, the NAND strings NS11 to NS13 which are electrically coupled to a first string select line SSL1 may form a first row, the NAND strings NS21 to NS23 which are electrically coupled to a second string select line SSL2 may form a second row, and the NAND strings NS31 to NS33 which are electrically coupled to a third string select line SSL3 may form a third row.

In each NAND string NS, heights may be defined. For example, in each NAND string NS, if the height of a memory cell MC1 adjacent to the ground select transistor GST is defined by a value of 1, the height of a memory cell MC7 adjacent to the string select transistor SST may be 7 times greater than the memory cell MC1. In each NAND string NS, the height of a memory cell, when measured from the substrate 5111, may increase as the memory cell is close to the string select transistor SST.

The string select transistors SST of the NAND strings NS of the same row may share the same string select line SSL. The string select transistors SST of the NAND strings NS in different rows may be respectively electrically coupled to different string select lines from each other.

The memory cells at the same height in the NAND strings NS of the same row may share a word line WL. That is, the word lines WL are commonly and electrically coupled to the memory cells MC of the NAND strings NS which are in different rows but in the same level or the same height. Dummy memory cells DMC at the same height or at the same level in the NAND strings NS may share a dummy word line DWL. That is, at the same height or level, the dummy word lines DWL electrically coupled to the dummy memory cells DMC of the NAND strings NS of different rows may be commonly electrically coupled with one another.

For example, word lines WL or dummy word lines DWL located at the same level or height or layer, may be commonly electrically coupled with one another. Conductive materials 5211 to 5291, 5212 to 5292 and 5213 to 5293 which are provided at a given level or height or layer, may be electrically coupled to upper layers through contacts. At upper layers, the conductive materials 5211 to 5291, 5212 to 5292 and 5213 to 5293 which extend in the first direction may be commonly electrically coupled with one another. The ground select transistors GST of the NAND strings NS may share the ground select line GSL. Further, the ground select transistors GST of the NAND strings NS in different rows may share the ground select line GSL. That is, the NAND strings NS 11 to NS13, NS21 to NS23 and NS31 to NS33 may be commonly electrically coupled to the ground select line GSL.

The common source line CSL may be commonly electrically coupled to the NAND strings NS. For example, on the active regions over the substrate 5111, the first to fourth doping regions 5311, 5312, 5313 and 5314 may be electrically coupled with one another. For example, the first to fourth doping regions 5311, 5312, 5313 and 5314 may be electrically coupled to an upper layer through contacts, and at the upper layer, the first to fourth doping regions 5311, 5312, 5313 and 5314 may be commonly electrically coupled with one another.

As shown in FIG. 8, the word lines WL at the same level or depth or layer, may be commonly electrically coupled with one another. Accordingly, when a certain word line WL is selected, all NAND strings NS which are electrically coupled to the certain word line WL may be selected. NAND strings NS in different rows may be electrically coupled to different string select lines SSL. Accordingly, by selecting one of the string select lines SSL1 to SSL3, the NAND strings NS of the rows not selected among the NAND strings NS electrically coupled to the same word line WL may be decoupled from the bit lines BL1 to BL3. That is, by selecting the string select lines SSL1 to SSL3, a specific row of NAND strings NS may be selected. Moreover, by selecting the bit lines BL1 to BL3, a specific NAND string NS in the selected row may be selected.

In each NAND string NS, a dummy memory cell DMC may be provided. In FIG. 8, the dummy memory cell DMC is provided between the third and the fourth memory cell in each NAND string NS. That is, first to third memory cells MC1 to MC3 may be provided between the dummy memory cell DMC and the ground select transistor GST.

Fourth to sixth memory cells MC4 to MC6 may be provided between the dummy memory cell DMC and the string select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group. Below, detailed descriptions will be made with reference to FIGS. 9 to 11, for a memory device in a memory system in accordance with the second embodiment. In the second embodiment, the memory device includes a 3-dimensional nonvolatile memory device and has a structure modified from the first structure shown in FIGS. 5-8.

Figure 9:
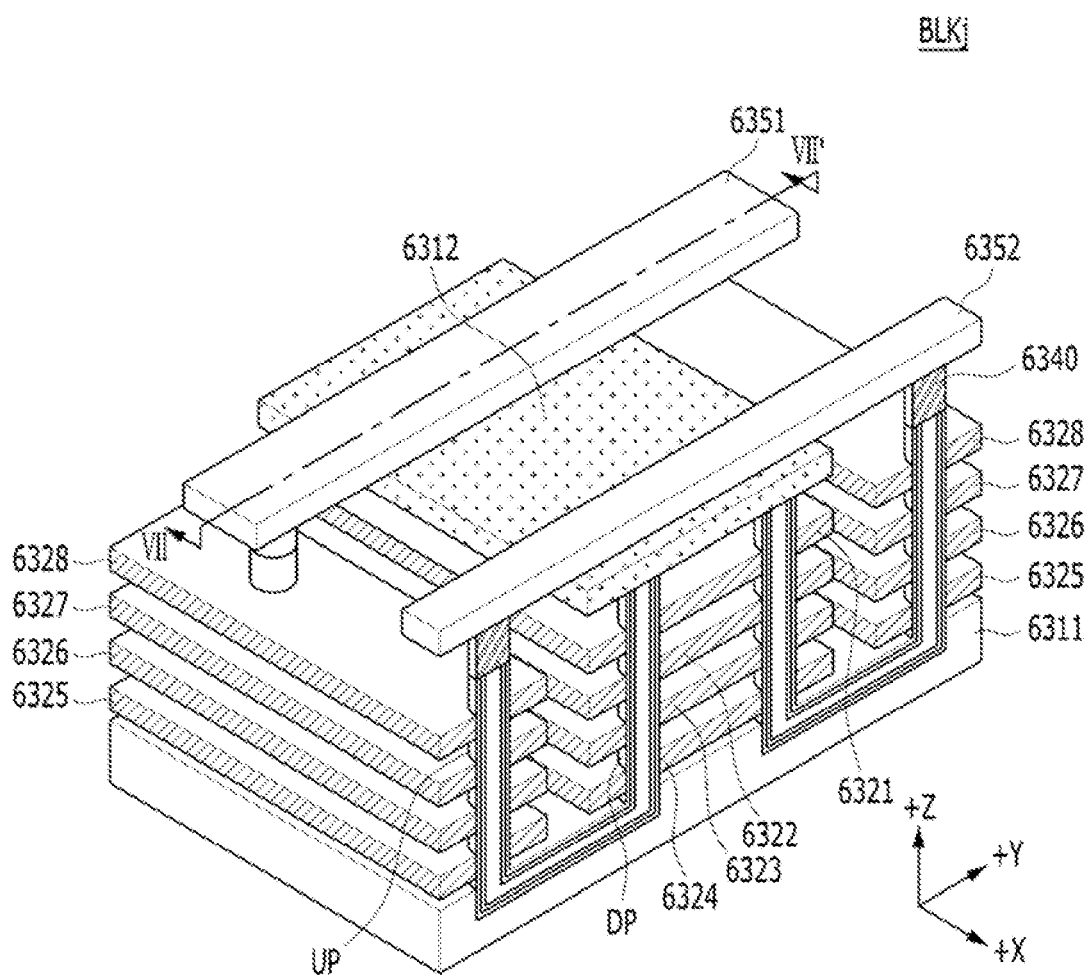
Figure 10:
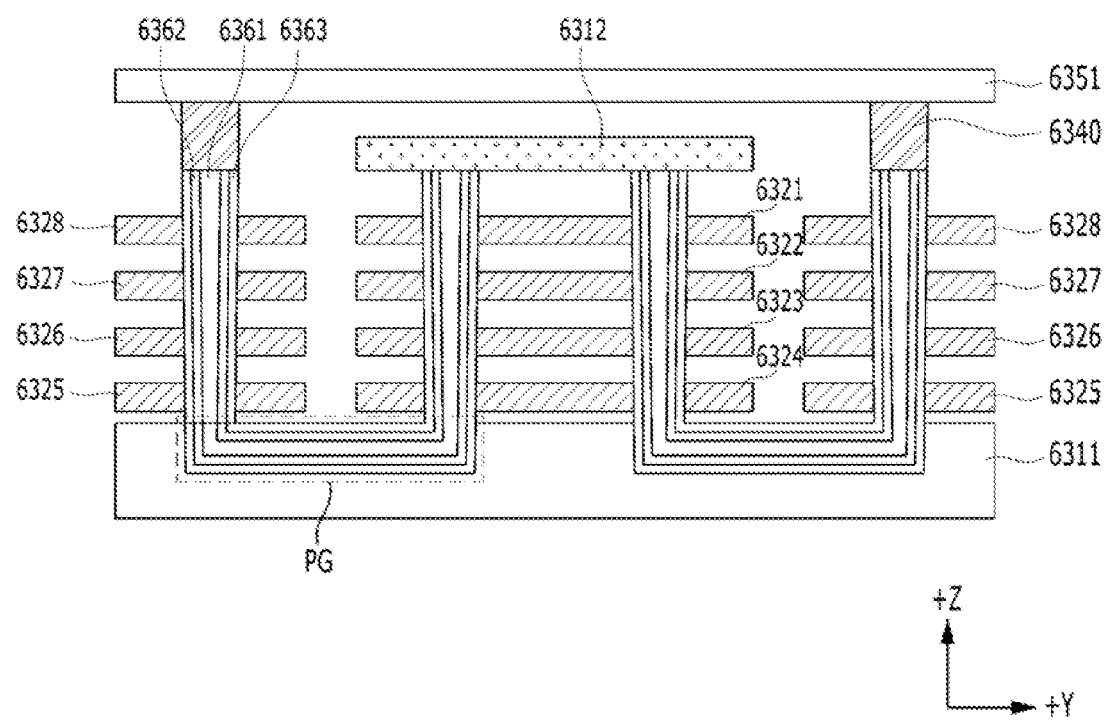

Referring to FIGS. 9 and 10, a certain memory block BLKj among the plurality of memory blocks of the memory device 150 may include structures which extend in the first to third directions. FIG. 9 is a perspective view of a memory device in accordance with the second embodiment. The memory device has a 3-dimensional structure different from the first structure described in FIGS. 5 to 8. In FIG. 4, a certain memory block BLKj may have the second structure shown in FIGS. 9-11. FIG. 10 is a cross-sectional view taken along the line VII-VII' of FIG. 9.

A substrate 6311 may be provided. For example, the substrate 6311 may include a silicon material doped with a first type impurity. For example, the substrate 6311 may include a silicon material doped with a p-type impurity or may be a p-type well for example, a pocket p-well, and include an n-type well which surrounds the p-type well. The substrate 6311 may be p-type silicon. However, it is to be noted that the substrate 6311 is not limited to the p-type silicon.

First to fourth conductive materials 6321, 6322, 6323 and 6324 which extend in the x-axis direction and the y-axis direction are provided on the substrate 6311. The first to fourth conductive materials 6321, 6322, 6323 and 6324 are separated by a predetermined distance in the z-axis direction.

Fifth to eighth conductive materials 6325, 6326, 6327 and 6328 which extend in the x-axis direction and the y-axis direction are provided on the substrate 6311. The fifth to eighth conductive materials 6325, 6326, 6327 and 6328 are separated by the predetermined distance in the z-axis direction. The fifth to eighth conductive materials 6325, 6326, 6327 and 6328 are separated from the first to fourth conductive materials 6321, 6322, 6323 and 6324 in the y-axis direction.

A plurality of lower pillars which pass through the first to fourth conductive materials 6321, 6322, 6323 and 6324 are provided. Each lower pillar DP extends in the z-axis direction. Also, a plurality of upper pillars which pass through the fifth to eighth conductive materials 6325, 6326, 6327 and 6328 are provided. Each upper pillar UP extends in the z-axis direction.

Each of the lower pillars DP and the upper pillars UP includes an internal material 6361, an intermediate layer 6362, and a surface layer 6363. As described above with reference to FIGS. 5 and 6, the intermediate layer 6362 operates as the channels of cell transistors. The surface layer 6363 includes a blocking dielectric layer, a charge storing layer, and a tunneling dielectric layer.

The lower pillar DP and the upper pillar UP are electrically coupled through a pipe gate PG. The pipe gate PG may be disposed in the substrate 6311. For instance, the pipe gate PG may include the same material as the lower pillar DP and the upper pillar UP.

A doping material 6312 doped with a second type dopant, which extends in the x-axis direction and the y-axis direction, is provided on the lower pillars DP. For example, the doping material 6312 doped with the second type dopant may include an n-type silicon material. The doping material 6312 doped with the second type dopant operates as a common source line CSL.

Drains 6340 are provided on the upper pillars UP. For example, the drains 6340 may include an n-type silicon material. First and second upper conductive materials 6351 and 6352 which extend in the y-axis direction are provided on the drains 6340.

The first and second upper conductive materials 6351 and 6352 are provided to be separated from each other and each extends in the x-axis direction. For example, the first and second upper conductive materials 6351 and 6352 may be formed of a metal. The first and second upper conductive materials 6351 and 6352 and the drains 6340 may be electrically coupled with each other through contact plugs. The first and second upper conductive materials 6351 and 6352 respectively operate as first and second bit lines BL1 and BL2.

The first conductive material 6321 operates as a source select line SSL, the second conductive material 6322 operates as a first dummy word line DWL1, and the third and fourth conductive materials 6323 and 6324 operate as first and second main word lines MWL1 and MWL2, respectively. The fifth and sixth conductive materials 6325 and 6326 operate as third and fourth main word lines MWL3 and MWL4, respectively, the seventh conductive material 6327 operates as a second dummy word line DWL2, and the eighth conductive material 6328 operates as a drain select line DSL.

The lower pillar DP and the first to fourth conductive materials 6321, 6322, 6323 and 6324 adjacent to the lower pillar DP form a lower string. The upper pillar UP and the fifth to eighth conductive materials 6325, 6326, 6327 and 6328 adjacent to the upper pillar UP form an upper string. The lower string and the upper string are electrically coupled through the pipe gate PG. One end of the lower string is electrically coupled to the doping material 6312 of the second type which operates as the common source line CSL. One end of the upper string is electrically coupled to a corresponding bit line through the drain 6340. One lower string and one upper string form one cell string which is electrically coupled between the doping material 6312 of the second type and the corresponding bit line.

That is, the lower string includes a source select transistor SST, the first dummy memory cell DMC1, and the first and second main memory cells MMC1 and MMC2. The upper string includes the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is substantially the same as the transistors described above in detail with reference to FIG. 7, detailed description thereof will be omitted herein.

Figure 11:
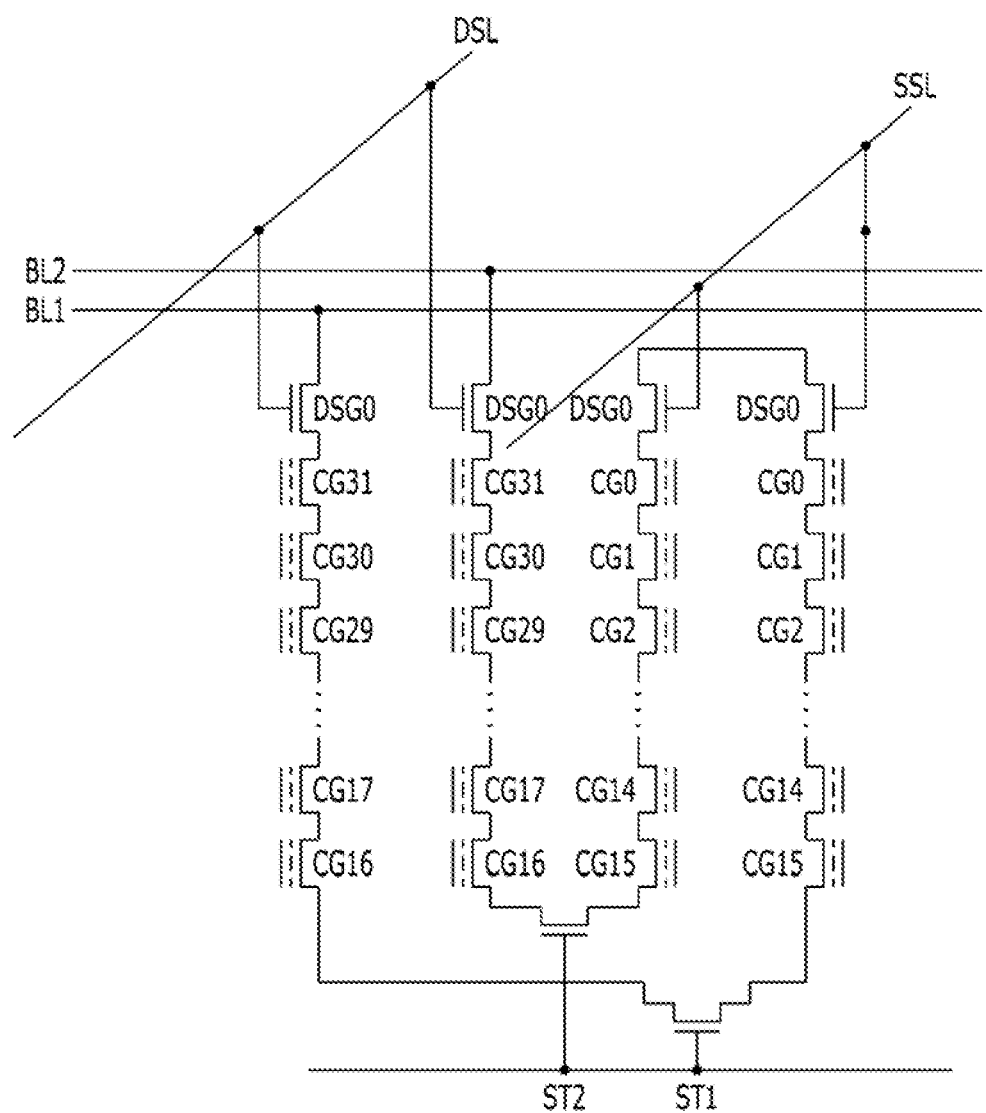

Referring to FIG. 11, in a certain memory block BLKj with the second structure, among the plurality of blocks of the memory device 150, as described above with reference to FIGS. 9 and 10, cell strings, each of which includes one upper string and one lower string electrically coupled to each through the pipe gate PG, may be provided in such a way as to define a plurality of pairs. FIG. 11 is a circuit diagram illustrating the equivalent circuit of the memory block BLKj which is described in FIGS. 9 and 10. For convenience of description in FIGS. 9-10, only a first string and a second string, which form a pair in the certain memory block BLKj of the second structure, are shown.

In a certain memory block BLKj with the second structure, the memory cells stacked along a first channel, for example, at least one source select gate and at least one drain select gate, form a first string ST1. The memory cells stacked along a second channel, for example, at least one source select gate and at least one drain select gate, form a second string ST2.

The first string ST1 and the second string ST2 are electrically coupled to the same drain select line DSL and the same source select line SSL. The first string ST1 is electrically coupled to a first bit line BL1, and the second string ST2 is electrically coupled to a second bit line BL2.

It is described in FIG. 11 that the first string ST1 and the second string ST2 are electrically coupled to the same drain select line DSL and the same source select line SSL. However, in another embodiment, the first string ST1 and the second string ST2 are electrically coupled to the same source select line SSL and the same bit line BL, and the first string ST1 is electrically coupled to a first drain select line DSL1 and the second string ST2 is electrically coupled to a second drain select line DSL2. In another embodiment, the first string ST1 and the second string ST2 are electrically coupled to the same drain select line DSL and the same bit line BL, and the first string ST1 is electrically coupled to a first source select line SSL1 and the second string ST2 is electrically coupled a second source select line SSL2.

Hereinafter a bad block management operation in a memory system in accordance with an embodiment will be described with reference to FIGS. 12 to 15.

Figure 12:
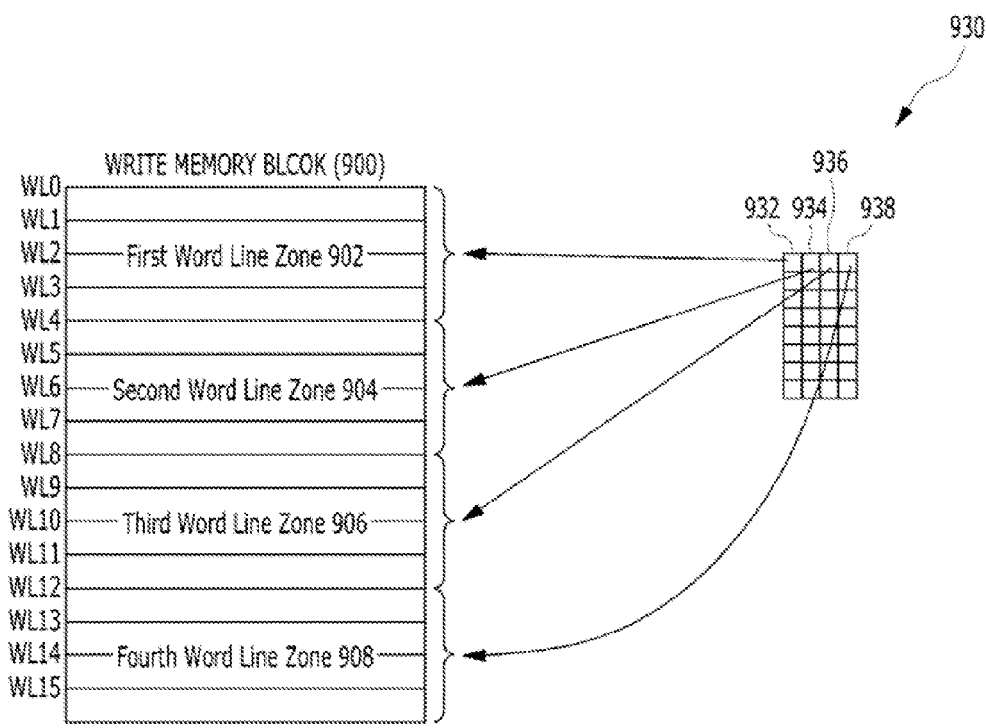
FIGS. 12 to 14 are block diagrams illustrating a bad block management operation in a memory system in accordance with an embodiment.
Figure 13:
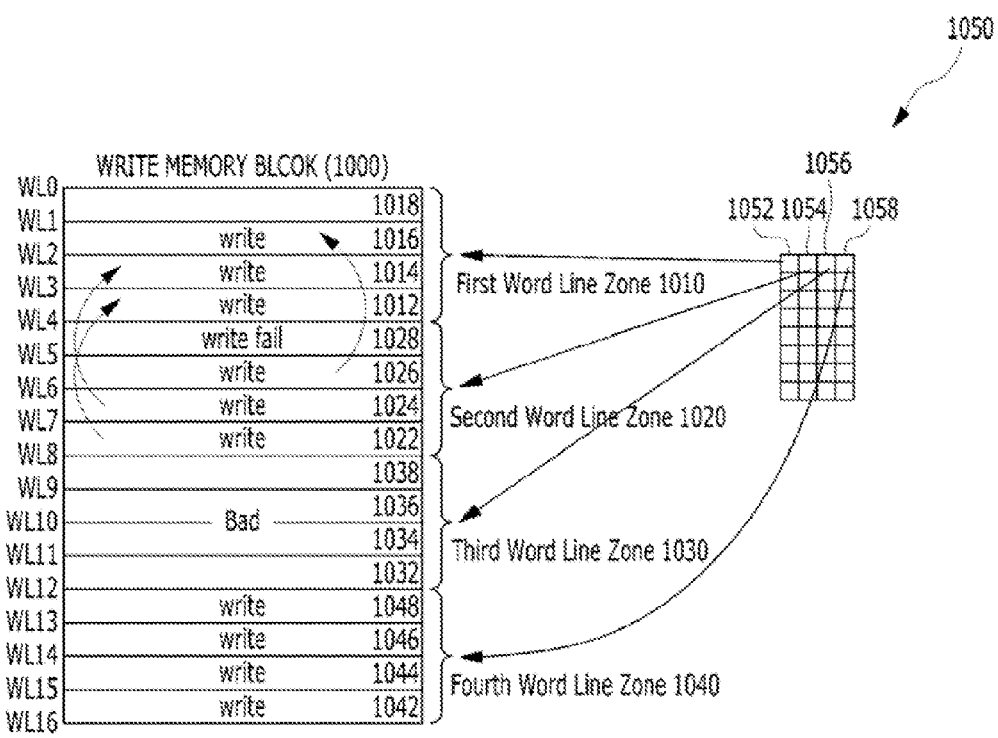
Figure 14:
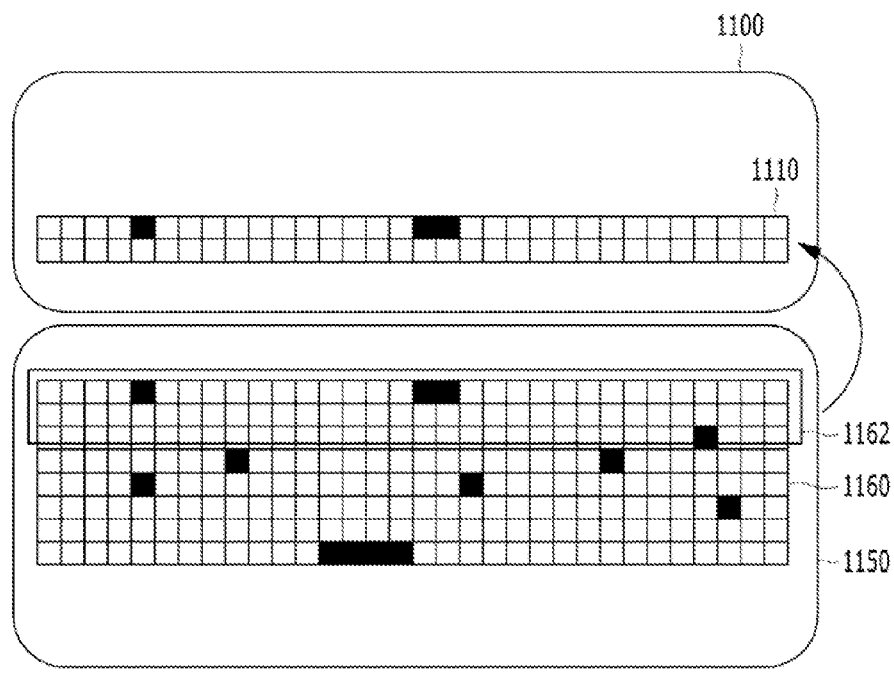

FIGS. 12 to 14 are block diagrams illustrating a bad block management operation in a memory system in accordance with an embodiment. For the convenience of the descriptions, a bad block management for one memory block out of a plurality of memory blocks in a memory device 150 shown in FIG. 2 will be exemplarily described. Additionally, a controller 130 may perform a bad block management operation in a memory system, as described above. However, in another embodiment, a processor 134 or a management unit included in the processor 134 may perform the bad block management operation.

Referring to FIG. 12, the controller 130 sets word line zones by grouping a plurality of word lines included in a plurality of memory blocks of the memory device 150 into a predetermined number of word lines. As shown in FIG. 12, a write memory block 900 in the plurality of memory blocks may include a plurality of pages. Each of the plurality of pages includes a plurality of memory cells coupled to a plurality of word lines WL0 to WL15. For example, the controller 150 sets first to fourth word lines WL0 to WL3 to a first word line zone 902, fifth to eighth word lines WL4 to WL7 to a second word line zone 904, ninth to twelfth word lines WL8 to WL11 to a third word line zone 906, and thirteenth to sixteenth word lines WL12 to WL15 to a fourth word line zone 908.

The controller 130 stores a table 930 to perform the bad block management in a memory 144. The table 930 may be a bad word line zone bitmap table in which information for the word line zones 902, 904, 906 and 908 of the write memory block 900 are stored. The write memory block 900 may include bitmap information 932, 934, 936 and 938 of each of the word line zones 902, 904, 906 and 908 and perform the bad block management for the word line zones 902, 904, 906 and 908 of the write memory block 900. The controller 150 checks the bad word line zone of each of the word line zones 902, 904, 906 and 908 based on the bitmap information 932, 934, 936 and 938 included in the table 930.

That is, the controller 130 (see FIG. 1) checks whether the first word line zone 902 is the bad word line zone based on the first bitmap information 932, whether the second word line zone 904 is the bad word line zone based on the second bitmap information 934, whether the third word line zone 906 is the bad word line zone based on the third bitmap information 936, and whether the fourth word line zone 908 is the bad word line zone based on the fourth bitmap information 938. Then, the controller 130 performs the bad block management.

As shown in FIG. 14, information for word line zones included in the plurality of memory blocks of the memory device 150 are stored in a first table. If a total size of the bitmap table 1160 of the bad word line zone is large, the bitmap table 1160 may be stored in the memory device 150, for example, a NAND flash memory. See FIG. 1.

Furthermore, the controller 130 stores a second table 1110 having information for the word line zones of specific memory blocks out of the plurality of memory blocks in a memory 144. See FIG. 1. For example, the controller 130 stores a bitmap table 1162 of the bad word line zone in the second table on the memory 144, such as, an SRAM to perform the bad block management after the bitmap information for the bad word line zone is acquired from the bitmap table 1160 of the NAND flash memory 1150. The controller 130 checks the bad word line zone for the word line zones of the specific memory block out of the plurality of memory blocks based on the bitmap information included in the second table 1110.

Hereinafter, a bad block management operation corresponding to a bad word line zone and a data write failure in accordance with an embodiment will be described with reference to FIG. 13.

Referring to FIG. 13, as described above, the controller 130 sets the word line zones by grouping the plurality of word lines included in the plurality of memory blocks of the memory device 150 into a predetermined number of word lines and performs bad block management. A write memory block 1000 in the plurality of memory blocks includes a plurality of pages. Each of the plurality of pages includes a plurality of memory cells coupled to the plurality of word lines WL0 to WL15. To perform the bad block management, the controller 130 sets word line zones by grouping the plurality of word lines. For example, the controller 130 sets first to fourth word lines WL0 to WL3 to a first word line zone 1010, fifth to eighth word lines WL4 to WL7 to a second word line zone 1020, ninth to twelfth word lines WL8 to WL11 to a third word line zone 1030 and thirteenth to sixteenth word lines WL12 to WL15 to a fourth word line zone 1040.

When the first to fourth word line zones 1010, 1020, 1030 and 1040 are in the write memory block 1000, corresponding memory cells are included in the first to fourth word line zones 1010, 1020, 1030 and 1040 by each of word lines. For example, first to fourth memory cells 1018, 1016, 1014 and 1012 are included in the first word line zone 1010, fifth to eighth memory cells 1028, 1026, 1024 and 1022 are included in the second word line zone 1020, ninth to twelfth memory cells 1038, 1036, 1034 and 1032 are included in the third word line zone 1030, and thirteenth to sixteenth memory cells 1048, 1046, 1044 and 1042 are included in the fourth word line zone 1040.

The controller 130 stores a table 1050 for performing the bad block management in the memory 144. The table 1050 may be a bitmap table of the bad word line zones having the information for the first to fourth word line zones 1010, 1020, 1030 and 1040 of the write memory block 1000. The bitmap information for each of the first to fourth word line zones 1010, 1020, 1030 and 1040 are included in the table 1050 such that the controller 130 performs the bad block management for the first to fourth word line zones 1010, 1020, 1030 and 1040 of the write memory block 1000. The controller 130 checks the bad word line zone of each of the first to fourth word line zones 1010, 1020, 1030 and 1040 based on the bitmap information included in the table 1050.

That is, the controller 130 checks whether the first word line zone 1010 is the bad word line zone based on the first bitmap information, whether the second word line zone 1020 is the bad word line zone based on the second bitmap information, whether the third word line zone 1030 is the bad word line zone based on the third bitmap information and whether the fourth word line zone 1040 is the bad word line zone based on the fourth bitmap information.

The controller 130 performs the bad block management after checking the bad word line zone of each of the first to fourth word line zones 1010, 1020, 1030 and 1040 based on the bitmap information 1052, 1054, 1056, 1058 included in the table 1050.

For example, as shown in FIG. 3, the controller 130 checks whether the fourth word line zone 1040 is the bad word line zone, and writes data on the thirteenth memory cell 1048, the fourteenth memory cell 1046, the fifteenth memory cell 1044 and the sixteenth memory cell 1042 since the fourth word line zone 1040 is a normal word line zone.

The controller 130 checks whether the third word line zone 1030 is the bad word line zone based on the third bitmap information 1056, and performs the bad block management for the third word line zone 1030 when it is determined that the third word line zone 103 is the bad word line zone. The third word line zone is the zone where subsequent data is supposed to be written next to the fourth word line zone. That is, the controller 130 checks whether the second word line zone 1020 is the bad word line zone based on the second bitmap information 1054 to determine if the data, which is supposed to be written in the third word line zone 1030 but failed to be written in the third word line zone 1030 since the third word line zone 1030 was determined as the bad word line zone, may be written in the second word line zone 1020, instead. The second word line zone is a zone where next data is supposed to be written next to the third word line zone. Since the third word line zone 1030 is the bad word line zone, the second word line zone 1020 of the write memory block 1000, which is included in the same memory block as the memory block of the third word line zone 1030, may be exemplarily described. However, the data to be written in the third word line zone 1030 may be written in any normal word line zone included in the same memory block 1000, other than the third word line zone 1030 of the write memory block 1000. Thus, the controller 130 checks whether the word line zones included in the memory block, other than the third word line zone 1030 of the write memory block 1000, is the bad word line zone. If the word line zone included in the memory block is a normal word line zone, the data which was supposed to be written in the third word line zone 1030 is written in the normal word line zone included in the memory block 1000, instead.

The controller 130 writes the data on the fifth to eighth memory cells 1028, 1026, 1024 and 1022 included in the second word line zone 1020 when the second word line zone 1020 is determined to be a normal word line zone. If the data is successfully written in the sixth to eighth memory cells 1026, 1024 and 1022 included in the second word line zone 1020 but is not written in the fifth memory cell 1028, the controller 130 checks the sixth to eighth memory cells 1026, 1024 and 1022 on which the data is successfully written and the fifth memory cell 1028 on which the data is not written. Then the controller 130 marks the second word line zone 1020, having a memory cell on which a data write failure occurred, as the bad word line zone and performs the bad block management for the second word line zone 1020.

Thus, the controller 130 checks whether the first word line zone 1010 is the bad word line zone based on the first bitmap information 1052 when the third word line zone 1030 was found to be a bad word line zone and the second word line zone 1020 is also found to have bad or defective word line(s).

If the first word line zone 1010 is found a normal word line zone, the controller 130 may write the data, which was supposed to be written in the third word line zone 1030, on the first to fourth memory cells 1018, 1016, 1014 and 1012 included in the first word line zone 1010. The controller 130 moves and rewrites the data written in the sixth to eighth memory cells 1026, 1024 and 1022 of the second word line zone 1020 to the memory cells of the first word line zone 1010. Specifically, the controller 130 moves and rewrites the data written on the eighth memory cell 1022 of the second word line zone 1020 to the fourth memory cell 1012 of the first word line zone 1010, moves and rewrite the data written on the seventh memory cell 1024 of the second word line zone 1020 to the third memory cell 1014 of the first word line zone 1010, and moves and rewrites the data written on the sixth memory cell 1026 of the second word line zone 1020 to the second memory cell 1016 of the first word line zone 1010.

For the convenience of the descriptions, in the above embodiment, the second word line zone 1020 which is found the bad word line zone and the first word line zone 1010 which is found a normal word line zone and selected as a substitute word line zone are included in the same memory block 1000. However, in another embodiment, the substitute word line zone may be selected from a memory block different from the memory block 1000 to which the bad or defective second word line zone 1020 belongs. Thus, the controller 130 checks whether a new word line zone included in the memory block is different from the write memory block 1000 to see if the new word line zone is a bad word line zone. If the word line zone included in the memory block different from the write memory block 1000, is a normal word line zone, the data written in the sixth to eighth memory cells 1026, 1024 and 1022 of the second word line zone 1020 are moved and rewritten in the new word line zone included in the memory block different from the write memory block 1000.

The memory system in accordance with an embodiment performs a grouping of the plurality of word lines included in each of the plurality of memory blocks, which is included in the memory device 150, into word line zones. The memory system performs the bad block management against the word line zones. That is, the memory system performs the bad block management by checking the bad word line zone out of the word line zones based on the bitmap table of the bad word line, checking whether the data write has failed in the memory cells of the word line zones, and rewriting the data which was supposed to be written on the bad word line zone to a substitute normal word line zone.

Hereinafter, operation of bad block management in a memory system in accordance with an embodiment will be described with reference to the flow chart shown in FIG. 15.

Figure 15:
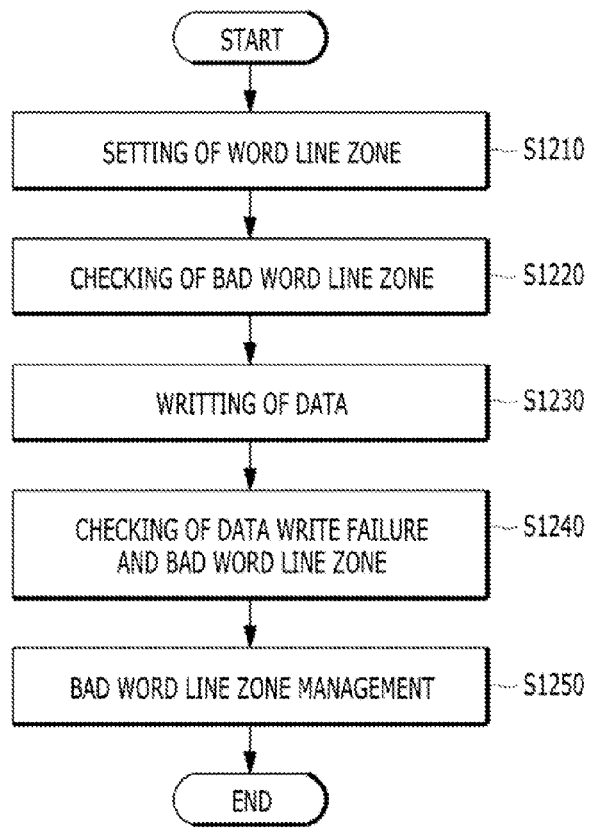
FIG. 15 is a flow chart illustrating a process of a bad block management in a memory system in accordance with an embodiment.

FIG. 15 is a flow chart illustrating a process of bad block management in a memory system in accordance with an embodiment.

Referring to FIG. 15, a memory system in accordance with an embodiment sets a plurality of word line zones by grouping a plurality of word lines coupled to the memory cells of each of pages in the plurality of memory blocks included in the memory device at step S1210.

At step S1220, a bad word line zone of the word line zones is checked based on bitmap information of a table corresponding to the bad block management.

At step S1230, data is written in a normal word line zone instead of the bad word line zone. That is, the data, which was supposed to be written in the bad word line zone, is written in the normal word line zone instead of the bad word line zone. The normal word line zone is selected among the word line zones which are behind the bad word line zone in the order of being subject to the bad block management operation. By using a subsequent normal word line zone as a substitute of the bad word line zone, a process of bad word line zone, namely, a bad management of the bad word line zone, or the bad block management is performed.

At step S1240, it is determined whether data write failures occurred in any of memory cells included in the newly selected normal word line zone. When it is determined that the word line zone includes a memory cell having data write failure, the word line zone is marked as a bad word line zone.

At step S1250, the bad word line zone including the memory cells having the data write fail is marked as the bad word line zone and is subject to bad word line zone management. That is, the data which is supposed to be written in the memory cells having the data write success in the bad word line zone is written in a memory cell of a new normal word line zone. The new normal word line zone is selected from word line zones which are behind the bad word line zone in the order of being subject to the bad block management operation. In this manner, the bad block management for the word line zone including a memory cell having a data write failure is performed.

What is claimed is:

1. A memory system, comprising:
   a memory device including a plurality of memory blocks, wherein each of the plurality of memory blocks includes a plurality of pages, wherein each of the plurality of pages includes a plurality of memory cells, and wherein the plurality of memory cells are coupled to a plurality of word lines; and
   a controller suitable for grouping the plurality of word lines to N number of word line zones, where N is integer equal to or greater than 2,
   wherein each of the word line zones includes M number of memory cells, where M is integer equal to or greater than 2, and
   wherein the controller performs a bad block management operation for word line zone by word line zone,
   wherein the controller stores a table having bitmap information for the N number of word line zones, checks if a bad word line zone exists among the N number of word line zones using the bitmap information stored in the table, and performs the bad block management operation for the bad word line zone.

2. The memory system of claim 1, wherein the controller performs the bad block management operation by writing data, which is supposed to be written on the bad word line zone, on a new word line zone selected from the plurality of word line zones.

3. The memory system of claim 2, wherein the new word line zone is next to the bad word line zone based on the order of the checking operation performed by the controller.

4. The memory system of claim 1, wherein the controller checks if a first memory cell fails a data write operation and identifies a first word line zone including the first memory cell as the bad word line zone.

5. The memory system of claim 4, wherein the controller performs the bad block management operation for the bad word line zone.

6. The memory system of claim 5, wherein the controller checks if a second memory cell succeeds in the data write operation and writes the data, which is supposed to be written on the first memory on the second memory cell,
   wherein the second memory cell is included in a second word line zone different from the first memory line zone.

7. The memory system of claim 6, wherein the second word line zone is next to the first word line zone based on the order of the checking operation performed by the controller.

8. The memory system of claim 1, wherein the memory device stores a first table including bitmap information for the word line zones included in the plurality of memory blocks, and
   wherein the controller stores a second table including the bitmap information for the word line zones included in a specific memory block out of the plurality of memory blocks.

9. The memory system of claim 8, wherein the controller acquires a portion of the first table from the memory device and stores the portion of the first table as the second table.

10. The memory system of claim 8, wherein the controller checks if a bad word line zone exists among the word line zones of the specific memory block based on the bitmap information included in the second table and performs the bad block management operation for the bad word line zone.

11. An operation method of a memory system, comprising:
providing a first memory block including a plurality of word lines,
grouping the plurality of word lines into N number of word line zones, where N is an integer equal to or larger than 2, wherein a plurality of memory cells are coupled to each of the plurality of word lines;
checking if a first word line zone, which is selected from the N number of word line zones, is a bad word line zone; and
performing bad block management operation for the bad word line zone,
wherein the checking of the first word line zone includes:
checking the first word line zone based on a table including bitmap information for the N number of word line zones.

12. The operation method of the memory system of claim 11, wherein the performing of the bad block management operation includes:
writing first data, which is supposed to be written on the first word line zone, on a second word line zone,
wherein the second word line zone is a normal word line zone.

13. The operation method of the memory system of claim 12, wherein the second word line zone is next to the first word line zone based on the order of the checking operation.

14. The operation method of the memory system of claim 11, wherein the checking of the first word line zone includes:
checking if a memory cell included in the first word line zone fails a data write operation, and
identifying the first word line zone including the memory cell which fails the data write operation as the bad word line zone.

15. The operation method of the memory system of claim 11, wherein the performing of the bad block management operation includes:
checking if a second memory cell included in a second word line zone succeed in a data write operation, and
writing first data, which is supposed to be written on a first memory cell included in the first word line zone, on the second memory cell included in the second word line zone.

16. The operation method of the memory system of claim 15, wherein the second word line zone is next to the bad word line zone based on the order of the checking operation.

17. The operation method of the memory system of claim 11, wherein the checking of the first word line zone includes:
storing a first table in the memory system,
acquiring from the memory system a portion of the first table and storing the acquired data as a second table, and
checking if the first word line zone is the bad word line zone based on bitmap information included in the second table.

18. The operation method of the memory system of claim 17, wherein the first table includes first bitmap information for the N number of word line zones included in the first memory block, and second bitmap information for L number of word line zones included in a second memory block, where L is integer equal to or larger than 2, and
wherein the second table includes the first bitmap information but does not include the second bitmap information.

* * * * *